(12) United States Patent
Bayan et al.

(10) Patent No.: US 6,483,180 B1
(45) Date of Patent: Nov. 19, 2002

(54) LEAD FRAME DESIGN FOR BURR-FREE SINGULATION OF MOLDED ARRAY PACKAGES

(75) Inventors: Jaime A. Bayan, Palo Alto; Peter Howard Spalding, Cupertino, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/470,826

(22) Filed: Dec. 23, 1999

(51) Int. Cl.[7] .................... H01L 23/48; H01L 23/12; H01L 23/34; H01L 23/495; H01L 23/28

(52) U.S. Cl. ............... 257/684; 257/796; 257/730; 257/666; 257/675; 257/676; 257/696; 257/698; 257/711; 257/709; 257/712; 257/693; 257/692; 257/672; 257/707; 257/706; 257/775; 174/524; 361/707

(58) Field of Search ................. 257/666, 690, 257/670, 672, 675, 676, 684, 692, 693, 696, 698, 707, 706, 709, 711, 712, 720, 730, 796; 174/52.4; 361/707

(56) References Cited

U.S. PATENT DOCUMENTS

| | | | | |
|---|---|---|---|---|
| 5,157,475 A | * | 10/1992 | Yamaguchi et al. | |
| 5,157,480 A | * | 10/1992 | McShane et al. | 361/405 |
| 5,172,214 A | * | 12/1992 | Casto | 257/676 |
| 5,521,429 A | * | 5/1996 | Aono et al. | 257/676 |
| 5,656,550 A | | 8/1997 | Tsuji et al. | |
| 5,783,861 A | * | 7/1998 | Son | 257/698 |
| 5,835,988 A | * | 11/1998 | Ishii | 257/684 |
| 5,859,387 A | * | 1/1999 | Gagnon | 257/676 |
| 5,861,668 A | * | 1/1999 | Cha | 257/692 |
| 5,886,397 A | * | 3/1999 | Ewer | 257/667 |
| 6,201,292 B1 | | 3/2001 | Yagi et al. | 257/666 |
| 6,201,294 B1 | * | 3/2001 | Lee | 257/669 |

* cited by examiner

Primary Examiner—Alexander O. Williams
(74) Attorney, Agent, or Firm—Beyer Weaver & Thomas, LLP

(57) ABSTRACT

A semiconductor device exhibiting a lower incidence of burrs forming on its contacts during the singulation process. The semiconductor device includes a die which is electrically connected to a set of contacts wherein each contact has a contact surface and a non-contact surface. Each contact surface of the contacts contains a recessed region filled with a first deposit of molding material. The die and the non-contact surfaces of the contacts are encapsulated with a second deposit of molding material. The semiconductor device is singulated from a molded lead frame by guiding a saw blade through recessed regions formed on the contact surface of the contacts. The molding material in the recessed regions creates a "buffer zone" which separates the path of the saw blade from the contact surface of the contacts. As a result, the formation of burrs is reduced because the sides of the saw blade are no longer in contact with the contact surface and are therefore unable to pull the contact surface into a burr formation. The molding material also prevents the contact material at the bottom of the recessed region, on the newly cut surface of the contact, from being pulled above the contact surface of the contact. The molding material in the recessed region accomplishes this by acting as a barrier which blocks the movement of contact material which may be pulled.

9 Claims, 7 Drawing Sheets

LEAD FRAME DESIGN FOR BURR-FREE SINGULATION OF MOLDED ARRAY PACKAGES

FIELD OF THE INVENTION

The present invention relates generally to semiconductor packaging. More specifically, the present invention relates to the packaging of semiconductor devices having a reduced incidence of burring at its contacts.

BACKGROUND OF THE INVENTION

Semiconductor integrated circuits (IC's) are typically fabricated in wafer form. After fabrication, individual die are cut from the wafer and then packaged. Generally, many die are packaged simultaneously on a metal lead frame. A lead frame includes tie bars which support an array of die attach pads and contacts which are associated with each die attach pad. A die is mounted onto each die attach pad and electrically connected to the associated contacts. The contacts provide the physical connection between the input and output terminals of the die and those of the circuit board. A molding material is then applied to encapsulate the die and the non-contact surfaces of the contacts. The molding material serves to protect the IC and makes it easier to handle. After the molding compound is applied, each packaged die is cut from the molded lead frame (e.g. "singulated") and is then ready to be mounted onto a circuit board.

Generally, singulation is performed by guiding a circular saw blade along the tie bars of the lead frame. As the cutting surface of the saw blade cuts through the lead frame and the molding compound, the sides of the saw blade, through frictional force, may pull some of the metal contact material above the contact surface of the contacts. This metal contact material thereby forms a thin sliver of metal, called a "burr," on the contact surface of the contact. Burrs may separate from the contacts while mounting the packaged die onto a circuit board. These free-floating burrs may cause the system on the circuit board to malfunction due to faulty connections or "short-circuits." Quality assurance procedures aimed at minimizing such problems adds to the cost and complexity of the packaging process.

In view of the of the foregoing, a semiconductor device exhibiting a lower incidence of burrs forming on its contacts during the singulation process would be desirable.

SUMMARY

The present invention relates to a semiconductor device exhibiting a lower incidence of burrs forming on its contacts during the singulation process. The semiconductor device includes a die which is electrically connected to a set of associated contacts wherein each contact has a contact surface and a non-contact surface. Each contact surface of the contacts contains a recessed region filled with a first deposit of molding material. The die and the non-contact surfaces of the contacts are encapsulated with a second deposit of molding material.

The semiconductor device is singulated from a molded lead frame by guiding a saw blade through the recessed regions formed on the contact surface of the contacts. The molding material in the recessed regions creates a "buffer zone" which separates the path of the saw blade from the contact surface of the contacts. As a result, the formation of burrs is reduced because the sides of the saw blade are no longer in contact with the contact surface and are therefore unable to pull the contact surface into a burr formation. The molding material also prevents the contact material at the bottom of the recessed region, on the newly cut surface of the contact, from being pulled above the contact surface of the contact. The molding material in the recessed region accomplishes this by acting as a barrier which blocks the movement of contact material which may be pulled. Additionally, any contact material which is pulled towards the contact surface becomes lodged in the molding material, thereby failing to reach the contact surface of the contact.

In sum, this invention results in a semiconductor device exhibiting a lower incidence of burrs forming on its contacts during the singulation process. This invention thereby minimizes the occurrence of faulty electrical connections upon the mounting of packaged die onto circuit boards and reduces the extent and cost of procedures aimed at detecting burrs.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
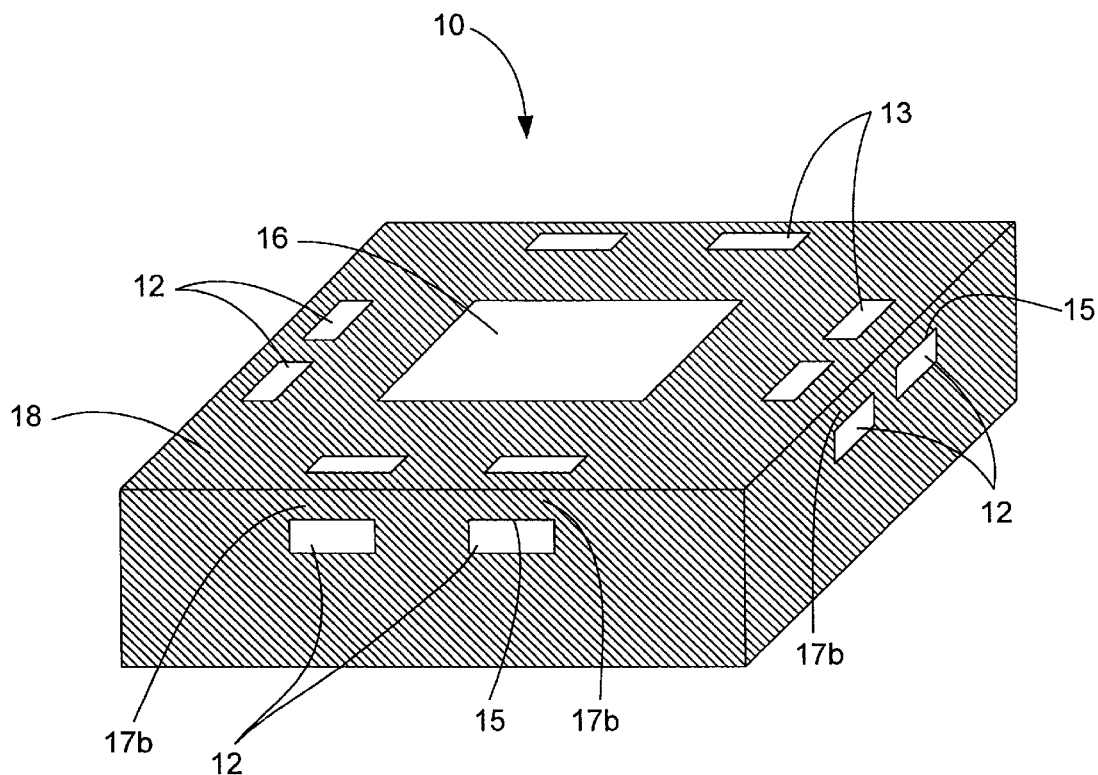
FIG. 1 is a perspective view of one embodiment of the semiconductor device of the subject invention.

FIG. 1 illustrates a semiconductor device 10 according to one embodiment of the invention. Semiconductor device 10 includes a set of contacts and a die attach pad 16 set in the surface of molding material 18. Each contact is an electrically conductive piece of material that will be referenced in the following FIGS. with reference numeral 12. Each contact includes a contact surface 13 that is exposed through the bottom surface 18' of the molding material 18. A portion of each contact is referred to as the supporting stem 19. The supporting stem 19 of each contact is exposed through only a side surface of the device 10 such that the exposed supporting stem 19 is offset from the outer perimeter of the side surfaces. The portion of the molding material 18 that separates the supporting stem 19 portion of the contacts from the bottom surface 18' of the device 10 is referred to as the barrier portion 17b. As will be discussed below, it is the barrier portion 17b that prevents burrs from forming during the manufacturing process of the device 10. Each of the top, bottom, and side surfaces of the device 10 are shown to be orthogonal to each other.

As will be seen in the following FIGS., the space filled by barrier portion 17b is referred to as a recessed region of the contacts. To summarize the nomenclature with reference to FIG. 2B, each of the contacts 12 has a support stem 19, a recessed region 15 is defined by the support stem 19 and the contact 12, and barrier portion 17b of the molding material 18 lies within the recessed region 15.

The contacts facilitate the electrical connection between the integrated circuit die (not shown), which is attached to the underside of the die attach pad 16 and packaged within the deposit of molding material 18, and a circuit board upon which the device is later mounted. The device is mounted by attaching the contact surfaces 13 of the contacts onto the circuit board. The molding material 18 may consist of a material such as epoxy resin or plastic. Each of the deposits of molding material 17b and 18 can be applied to the semiconductor device simultaneously or one after the other without regard to the order of application. This embodiment of the semiconductor device 10 is known as a "chip scaled packaged" (CSP) device because the package is only slightly larger than the integrated circuit chip (or die) that is packaged within the deposit of molding material 18. The number and shape of the contacts in semiconductor device 10 can vary.

Figure 2A:
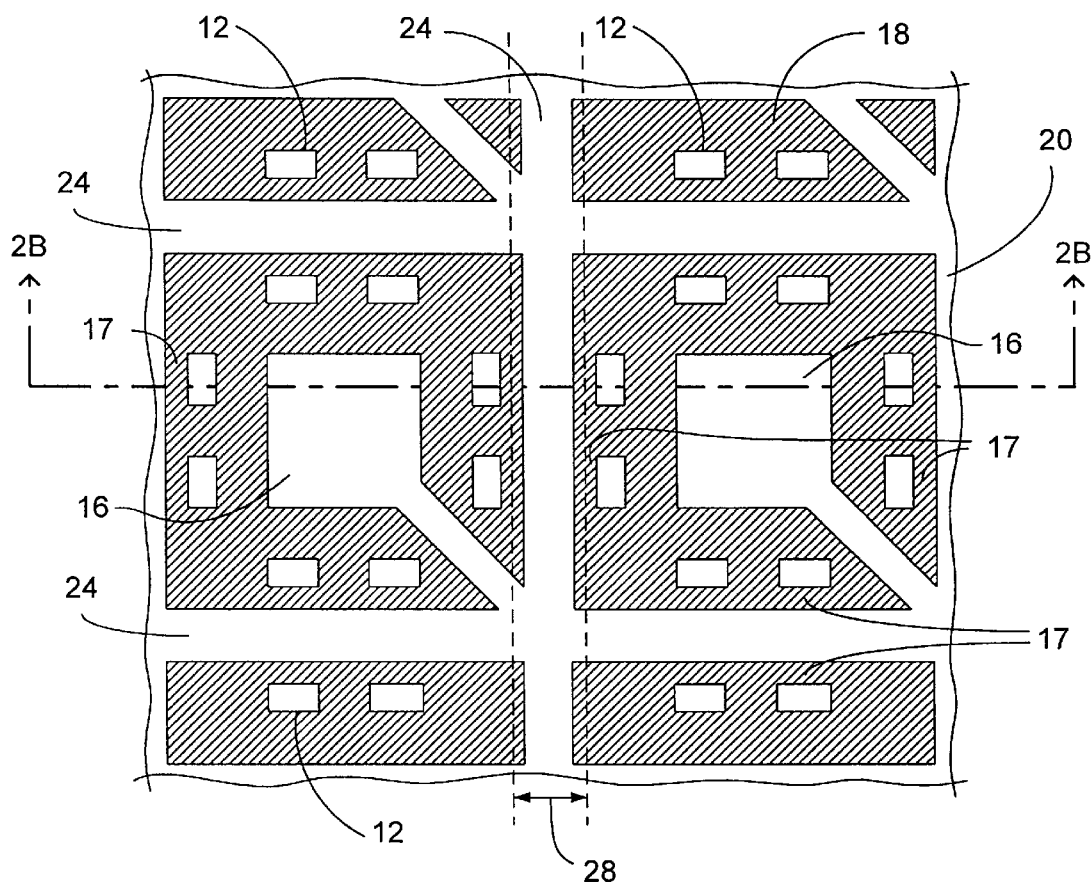
FIG. 2A is a top plan view of one embodiment of the lead frame of the subject invention.
Figure 2B:
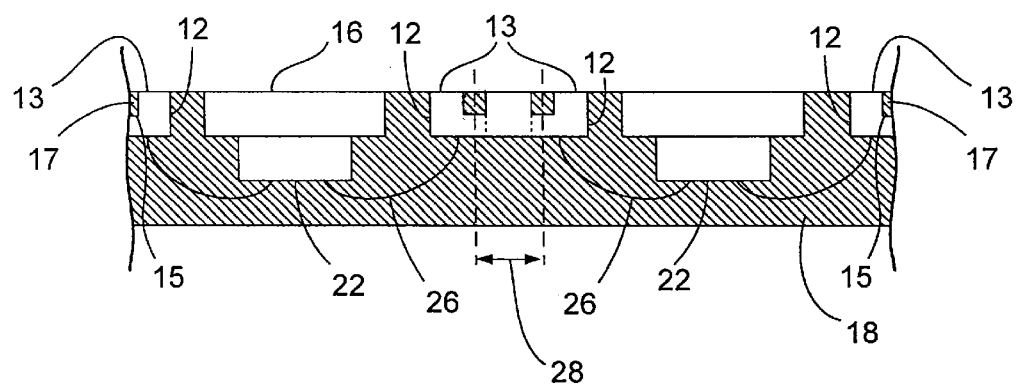
FIG. 2B is a cross-sectional view of the lead frame of FIG. 2A.

FIG. 2A illustrates a top plan view of a lead frame 20, which contains the semiconductor device 10 prior to the singulation process. FIG. 2B illustrates the respective cross-sectional view of the lead frame 20 in FIG. 2A along line A–A'. Lead frame 20 includes tie bars 24, wherein one set of tie bars are arranged in a parallel pattern and another set of tie bars are arranged in a parallel pattern intersecting the first set of tie bars in a perpendicular orientation. Contacts and die attach pads 16 extend from each edge of the tie bars 24 such that the contact surfaces 13 of the contacts 12 are positioned adjacent to the perimeter of the die attach pads 16. The tie bars 24, contacts and the die attach pads 16 are formed from metal, such as copper, but may be formed from other materials. Recessed regions are formed within each contact by etching with copper etchant, stamping the lead frame during its manufacturing process, or any method capable of removing the lead frame material in this region.

As illustrated in FIG. 2B, the die 22 are attached to the die attach pad 16 and are electrically connected to the contacts 12 through connecting wires 26. The connecting wires in one embodiment are made of gold. In other embodiments the connecting wires may consist of any material which conducts electricity, such as copper. Support stems 19 of the contacts 12 are shown to connect the contacts 12 to the tie bars 24. The tie bars 24, contacts 12, die attach pads 16, die 22, and the connecting wires 26 are set in the deposit of molding material 18. Saw street 28 illustrates the path of the saw blade, which cuts the packaged die from the lead frame 20. This process of cutting the packaged die from the lead frame 20 is known as "singulation." After the saw blade passes through the saw street 28, the support stems 19 will be exposed on the side surfaces of the resulting semiconductor package.

Figure 2C:
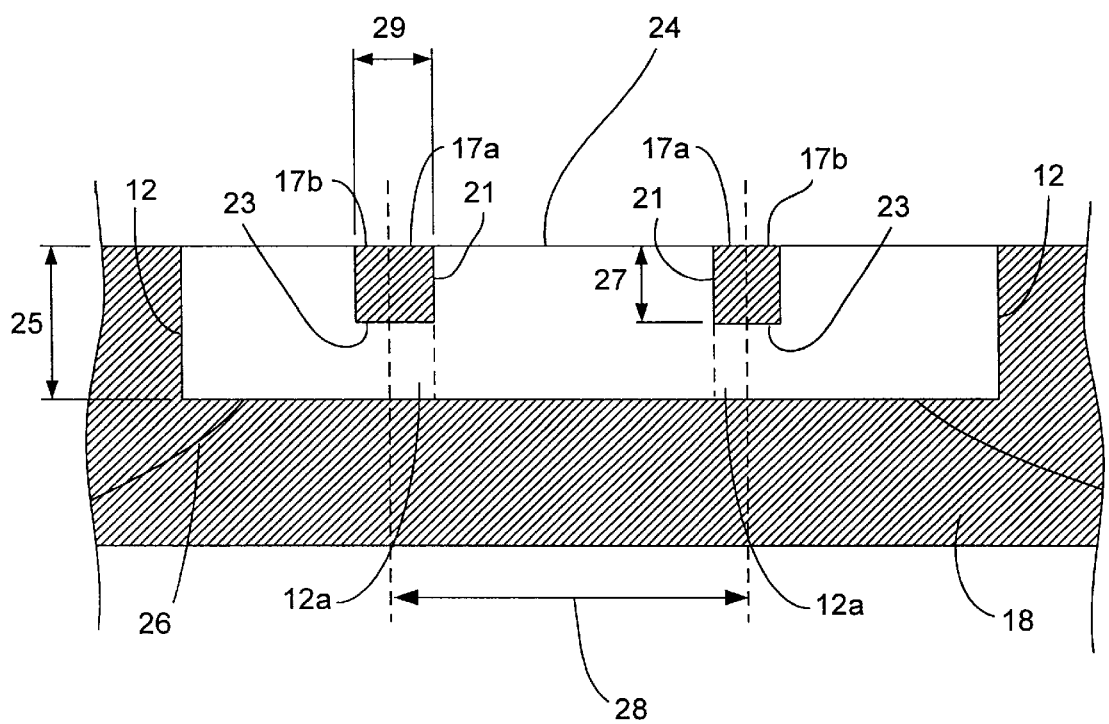
FIG. 2C is an exploded view of the saw street region of FIG. 2B.

FIG. 2C illustrates an exploded view of the saw street 28 region of FIG. 2B. In this embodiment, the recessed regions 15 have substantially vertical side walls 21, a bottom surface 23, a depth 27 and a width 29. The saw street 28 has a width which is slightly wider than the tie bar 24. The boundaries of the saw street 28 pass through the recessed regions 15 so that portions of the deposits of molding material 17 reside both inside, 17a, and outside, 17b, of the saw street. The molding material 17 must bond with the side walls 21 and the bottom surface 23 of the recessed region 15 sufficiently so that the molding material 17b outside of the saw street 28 will not be dislodged by the sides of the saw blade during the singulation process. Since the strength of the bond increases with the amount of surface area to which the molding material 17b can be attached, the recessed region 15 must have certain minimum dimensions. In a preferred embodiment, the recessed region has a depth 27 equal to approximately one-half the thickness 25 of the contact 12 and a molding material width 29 which extends approximately 2 mils beyond the boundary of the saw street 28. As can be appreciated by those of skill in the art, the dimensions of the recessed region 15 may be smaller than those of the preferred embodiment discussed above, particularly with future generations of chips having smaller geometries and with future molding materials having greater adhesive qualities. During the singulation process, the saw blade removes the material within the boundaries of the saw street 28. The removed material includes the tie bar 24, the portion of the deposit of molding material 17a which is within the saw street 28, the portion of the contact within the saw street 12a, and the deposit of molding material 18 within the saw street.

Figure 3:
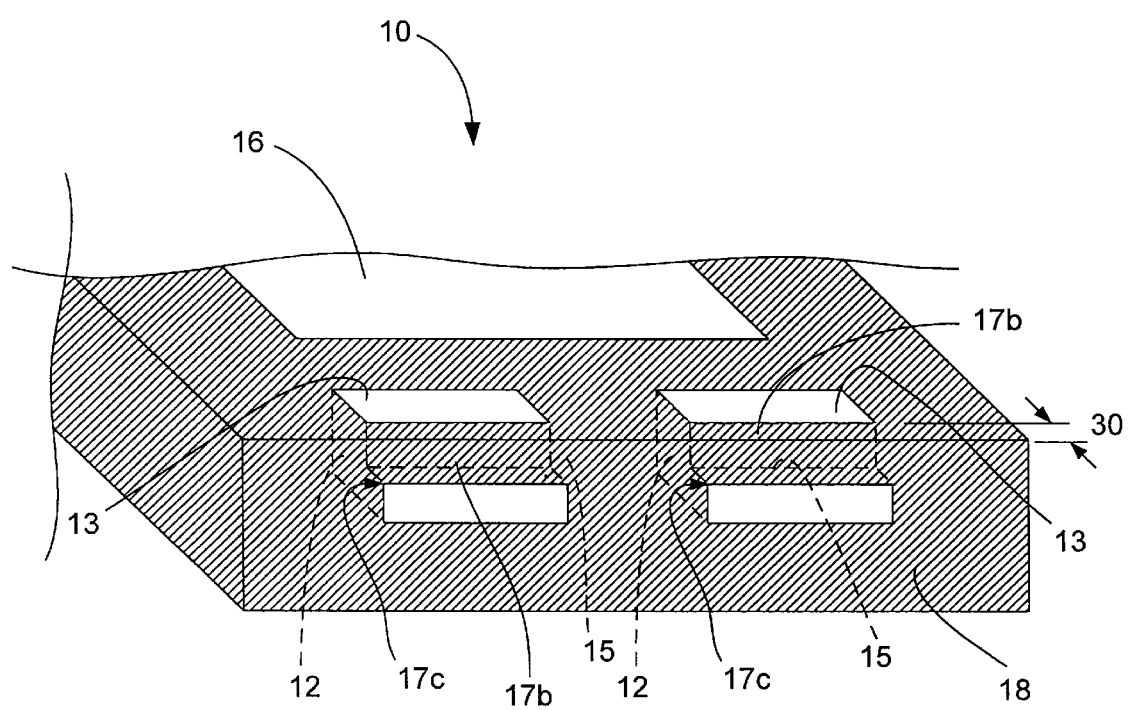
FIG. 3 is a perspective view of a semiconductor device after the device has been singulated from the lead frame of FIG. 2A.

FIG. 3 illustrates a perspective view of a semiconductor device 10 after the device has been singulated from the lead frame. This figure is helpful in describing how the molding material contained in the recessed regions 15 reduces the incidence of burring on the contact surface 13 of the contacts 12. The molding material 17b contained in the recessed regions 15 creates a buffer zone 30 which separates the path of the saw blade from the contact material near the contact surface 13 of the contacts 12. As a result, the formation of burrs is substantially eliminated because the sides of the saw blade are no longer able to pull the contact material near the contact surface 13 into a burr formation. The molding material 17b also prevents the contact material along the bottom edge 17c of the recessed region 15, on the newly cut surface 32 of the contact, from being pulled above the contact surface 13. The molding material 17b accomplishes this by acting as a barrier which tends to block the movement of contact material which may be pulled. Any contact material which is pulled towards the contact surface 13 becomes lodged in the molding material 17b, thereby failing to reach the contact surface 13 of the contact.

Figure 4A:
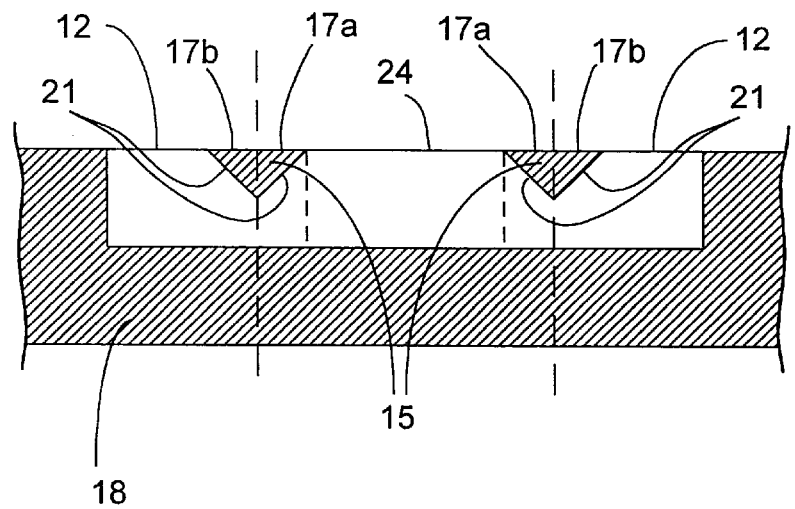
FIG. 4A is a cross-sectional view of an alternative embodiment of the recessed regions prior to the singulation process.
Figure 4B:
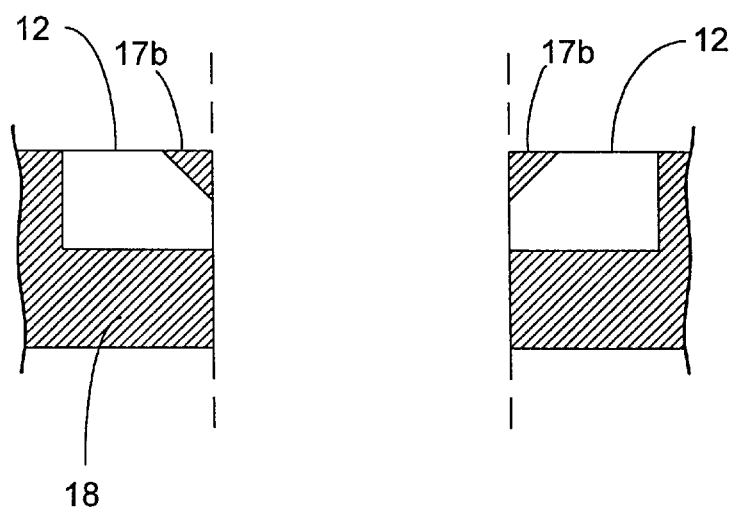
FIG. 4B is a cross-sectional view of the recessed regions of FIG. 4A after the singulation process.

FIG. 4A illustrates a cross-sectional view of an alternative embodiment of the recessed regions 15 contained within the lead frame 20. Recessed regions 15 are formed within the contacts 12. The recessed regions 15 contain deposits of molding material residing inside, 17a, and outside, 17b, of the saw street 28. The recessed regions 15 have side walls 21 which converge upon each other towards the bottom of each recessed region. As can be appreciated by those of skill in the art, the cross-sectional shape of the recessed region may vary. The saw street 28 is aligned so that the boundaries of the saw street 28 pass through the recessed regions 15. FIG. 4B illustrates the lead frame 20 of FIG. 4A after the singulation process. Material within the boundaries of the saw street 28, which includes deposits 17a of molding material, have been removed by the saw blade.

Figure 5A:
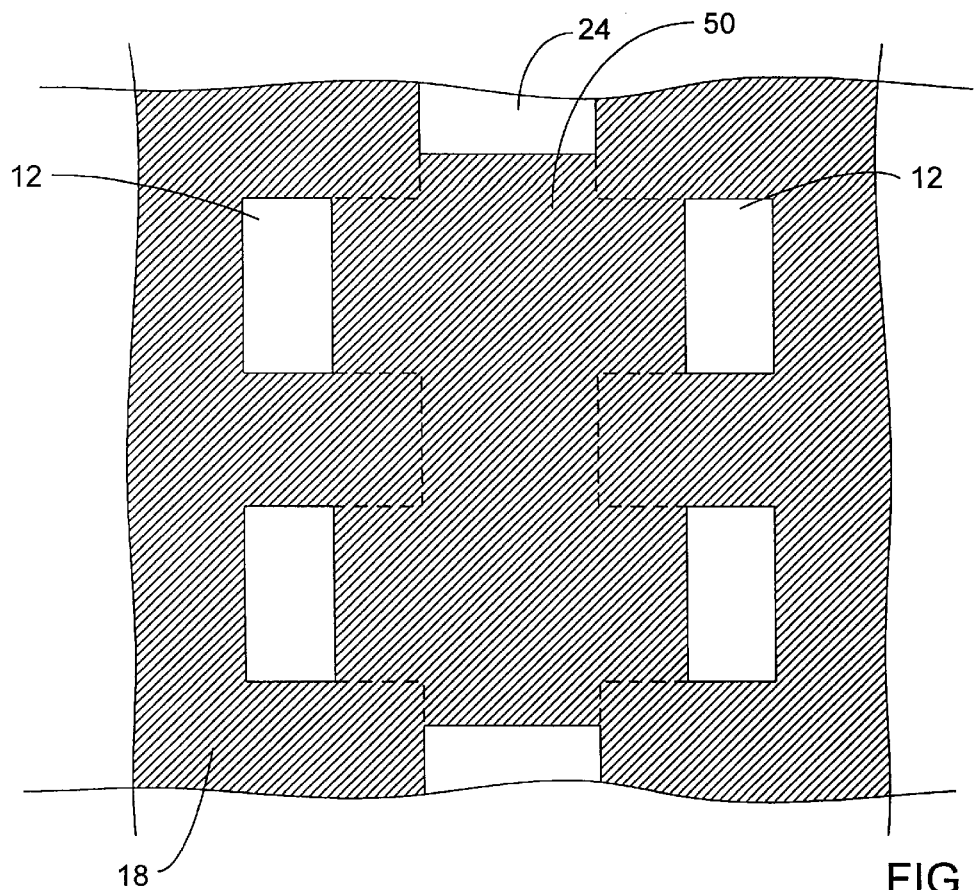
FIG. 5A is a top plan view of another alternative embodiment of the recessed regions prior to the singulation process.
Figure 5B:
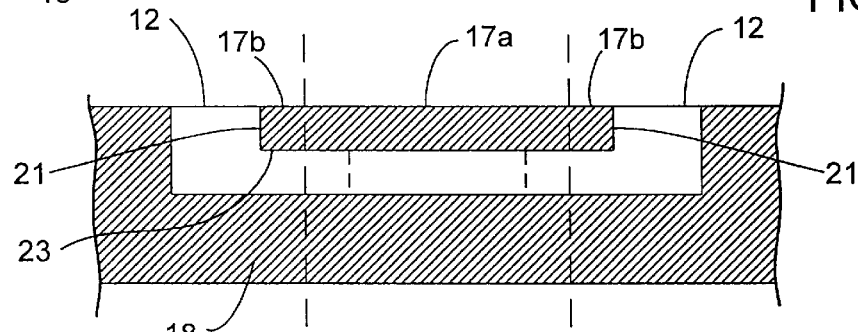
FIG. 5B is a cross-sectional view of the recessed region of FIG. 5A prior to the singulation process.
Figure 5C:
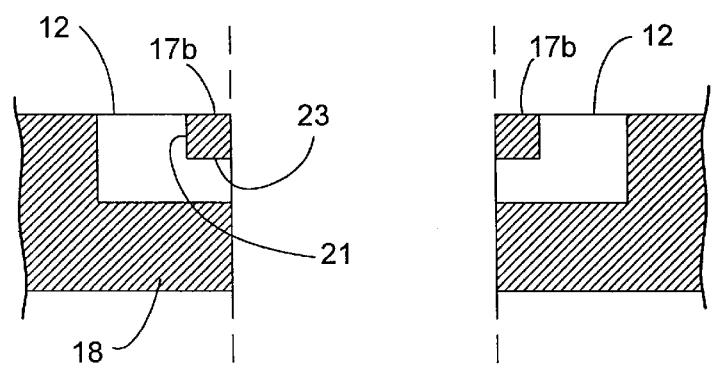
FIG. 5C is a cross-sectional view of the recessed regions of FIG.5A after the singulation process.

FIG. 5A illustrates a top plan view of an alternative embodiment of the recessed regions contained within the lead frame 20. A continuous recessed channel 50 is formed along the tie bar 24 and in the contacts 12. FIG. 5B, illustrating a cross-sectional view of the lead frame in FIG. 5A, shows that the recessed channel 50 has two substantially vertical side walls 21 with a flat bottom surface 23. As can be appreciated by those of skill in the art, the cross-sectional shape of the recessed region may vary. The recessed channel 50 contains a deposit of molding material residing inside, 17a, and outside, 17b, of the saw street 28. The saw street 28 is aligned so that the entire width of the saw blade will pass through the recessed channel 50. FIG. 5C illustrates the lead frame 20 of FIG. 5A after the singulation process. Material within the boundaries of the saw street 28, which includes deposit 17a of molding material, has been removed by the saw blade.

Figure 6A:
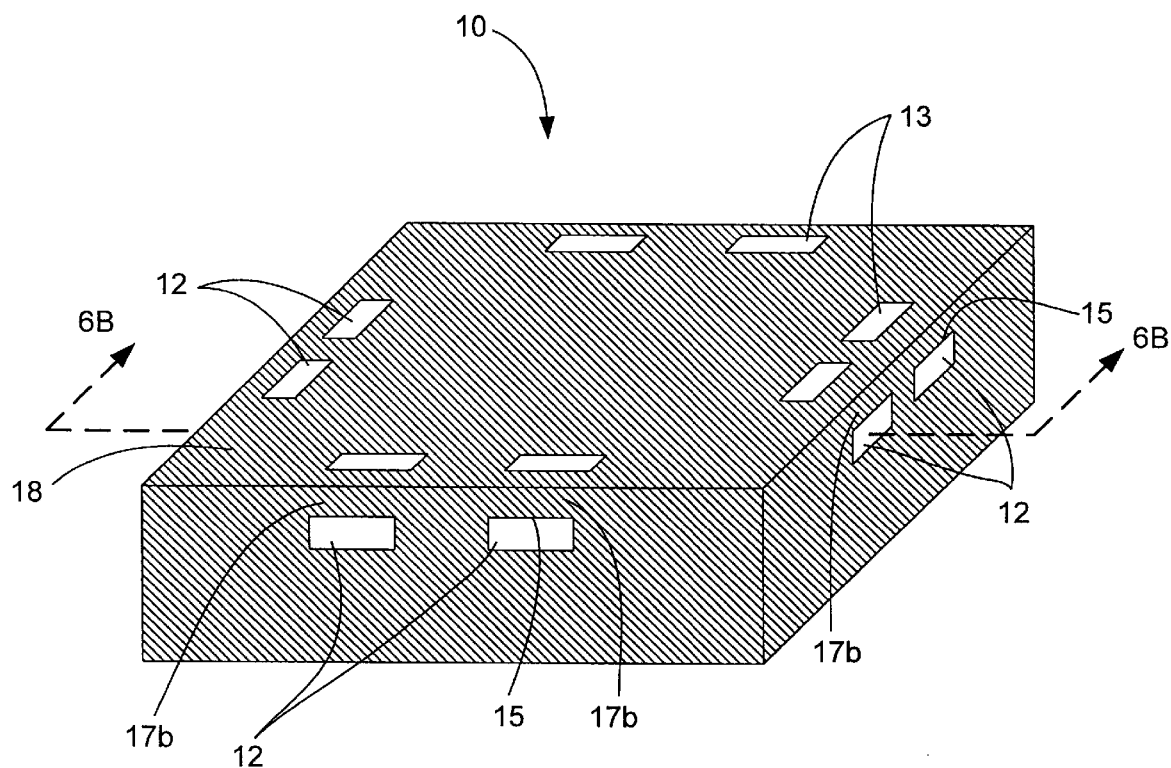
FIG. 6A is a perspective view of an alternative embodiment of the semiconductor device, known as a "flip-chip."
Figure 6B:
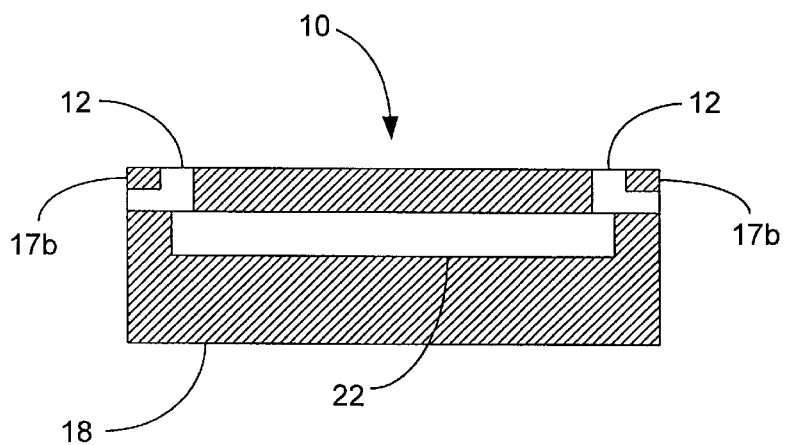
FIG. 6B is a cross-sectional view of the semiconductor device of FIG. 6A.

FIG. 6A illustrates a perspective view of an alternative embodiment of the semiconductor device 10. This embodiment of the semiconductor device 10, known as a "flip chip," includes a set of contacts 12 set in the surface of a deposit of molding material 18. The contacts 12 facilitate the electrical connection between the integrated circuit die, which is packaged within the deposit of molding material 18, and a circuit board upon which the device is mounted. Recessed regions 15 are formed within each contact 12 wherein each recessed region 15 is filled with a deposit of molding material 17b. FIG. 6B illustrates a cross-sectional view of the semiconductor device 10 as shown in FIG. 6A along lines 6B—6B. A die 22 is set within the deposit of molding material 18 and is directly attached to the contacts 12. As can be appreciated by those skilled in the art, the number and shape of the contacts in semiconductor device 10 can vary.

While this invention has been described in terms of several preferred embodiments, there are alteration, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A semiconductor device package comprising:
    a molding material block having a top surface, a bottom surface, and a plurality of completely flat side surfaces that are orthogonal to both of the top and bottom surfaces;
    a semiconductor die embedded within the molding material block;
    a plurality of contacts having completely flat surfaces that are embedded within the molding material such that a contact surface of each of the contacts is exposed through the bottom surface of the block at an offset distance from the outer perimeter of the bottom surface, each of the contacts being electrically connected to the semiconductor die; and
    a rectangular support stem having completely flat surfaces extending from each of the contacts such that an end portion of each of the support stems is exposed through the block only at a respective side surface, each of the exposed end portions being flush with the side surfaces of the block, wherein each of the exposed end portions form a respective end portion surface and wherein each of the side surfaces have surrouding surface regions that surround each of the end portion surfaces and extend from each edge of the end portion surfaces at least a distance equal to the distance from the bottom surface of the package to one of the exposed end portions,
    wherein the outer perimeters of the top surface, bottom surface, and side surfaces are formed of only molding material of the molding material block and wherein the completely flat side surfaces of the molding material block serve to capture metal burrs pulled out from the rectangular support stems during a singulation process that uses a saw blade.

2. The semiconductor device package as recited in claim 1 further comprising:
    a die attach pad, the die attach pad supporting the die; and
    a plurality of electrical connection elements which facilitate the electrical connection between the die and each of the plurality of the contacts.

3. The semiconductor device package as recited in claim 2, wherein the electrical connection elements are wires.

4. The semiconductor device package as recited in claim 1, wherein the die is in direct electrical contact with each of the contacts.

5. A leadless leadframe panel assembly suitable for use in semiconductor device packaging, the panel assembly comprising:
    a leadframe panel having a plurality of semiconductor device areas, each semiconductor device area having a plurality of contacts, the leadframe panel having a plurality of tie bars that support the contacts and define an outer perimeter of each of the device areas, the contacts having recessed regions adjacent to the tie bars such that the recessed regions are substantially aligned along the outer perimeter of each device area;
    a plurality of dice mounted on the leadframe panel, each die being electrically connected to associated contacts within an associated device area;
    a molding material that fills the recessed regions and covers at least a portion of the dice and the contacts while leaving at least a portion of the contacts exposed to form electrical contact surfaces, the electrical contact surfaces being offset from the outer perimeter of each of the device areas by the recessed regions,
    wherein each of the tie bars have a first edge and a second edge, each edge supporting at least one of the contacts, the recessed regions in each of the contacts on the first edge being integrally formed with a recessed region in a respective contact on the second edge such that a continuous recessed region that spans the width of the tie bar is formed between each of the respective contacts on the first and second edge of the tie bar.

6. The leadless leadframe panel assembly as recited in claim 5, wherein the recessed regions each have two substantially vertical side walls and a flat bottom surface.

7. The leadless leadframe panel assembly as recited in claim 5, wherein the recessed regions have two side walls which converge upon each other towards the bottom of the recessed region.

8. The leadless leadframe panel assembly as recited in claim 5, wherein the recessed regions have a depth and the contacts have a thickness, wherein the depth of each of the recessed regions is at least one half of the thickness of the contacts.

9. The leadless leadframe panel assembly as recited in claim 5, wherein the a recessed regions span a distance of at least 2 mils in width.

* * * * *